United States Patent
Mortain et al.

(10) Patent No.: US 10,923,845 B2
(45) Date of Patent: Feb. 16, 2021

(54) ELECTRICAL EQUIPMENT FOR AN AUTOMOBILE VEHICLE

(71) Applicant: Valeo Siemens eAutomotive France SAS, Cergy (FR)

(72) Inventors: Eloi Mortain, Suresnes (FR); Sébastien Hary, Persan (FR)

(73) Assignee: Vako Siemens eAutomotive France SAS, Cergy (FR)

( * ) Notice: Subject to any disclaimer, the term of this patent is extended or adjusted under 35 U.S.C. 154(b) by 0 days.

(21) Appl. No.: 16/538,421

(22) Filed: Aug. 12, 2019

(65) Prior Publication Data
US 2020/0052426 A1 Feb. 13, 2020

(30) Foreign Application Priority Data
Aug. 13, 2018 (FR) ...................... 18 57465

(51) Int. Cl.
*H01R 13/11* (2006.01)
*H05K 1/18* (2006.01)

(52) U.S. Cl.
CPC ............. *H01R 13/113* (2013.01); *H05K 1/18* (2013.01); *H05K 2201/10325* (2013.01); *H05K 2201/10522* (2013.01)

(58) Field of Classification Search
CPC ... H01R 13/113; H01R 13/114; H01R 13/111; H01R 13/04; H01R 13/05; H01R 13/08; H01R 13/10; H01R 13/15
USPC ........ 439/81, 82, 91, 66, 76.1, 74, 845, 849, 439/850
See application file for complete search history.

(56) References Cited

U.S. PATENT DOCUMENTS

| 3,383,638 | A | 5/1968 | Coldren | |
| 3,550,069 | A * | 12/1970 | Teagno Wladimiro | ...................... H01R 13/115 439/849 |
| 6,702,595 | B2 * | 3/2004 | Nelson | ................. H01R 13/115 439/83 |
| 7,086,912 | B2 * | 8/2006 | Matsuura | ............. H01R 13/113 439/845 |
| 7,128,623 | B2 * | 10/2006 | Kitajima | .............. H01R 13/055 439/876 |
| 7,140,895 | B2 * | 11/2006 | Tuin | ........................ H01R 12/57 439/246 |
| 7,556,509 | B1 * | 7/2009 | Oh | ........................ H01R 13/112 439/76.2 |

(Continued)

FOREIGN PATENT DOCUMENTS

DE   20 2009 010426 U1   11/2009

OTHER PUBLICATIONS

Search Report from French Intellectual Property Office on co-pending FR application (FR1857465) dated May 2, 2019.

*Primary Examiner* — Harshad C Patel
(74) *Attorney, Agent, or Firm* — Klein, O'Neill & Singh, LLP

(57) ABSTRACT

The subject matter of the invention is an electrical equipment, notably configured to be on board a vehicle, including an electronic board, a female electrical connector transferred onto the electronic board and configured to receive a blade so as to electrically connect it with the electronic board. Said connector includes two claws opposite and at a distance from each other, the two claws being configured to receive said blade while each coming around a respective lateral trench of the blade.

6 Claims, 2 Drawing Sheets

(56) References Cited

U.S. PATENT DOCUMENTS

| | | | | |
|---|---|---|---|---|
| 7,740,511 B2* | 6/2010 | Katano | ................ | H01R 13/113 |
| | | | | 439/816 |
| 7,909,620 B2* | 3/2011 | Masaki | ................ | H01R 12/718 |
| | | | | 439/81 |
| 7,980,859 B2* | 7/2011 | Mizumura | ......... | H01R 13/6315 |
| | | | | 439/248 |
| 8,137,116 B2* | 3/2012 | Omori | .................. | H01R 13/648 |
| | | | | 439/883 |
| 8,715,018 B2* | 5/2014 | Yoshikawa | .......... | H01R 13/187 |
| | | | | 439/850 |
| 9,318,829 B2* | 4/2016 | Yu | .......................... | H01R 13/18 |
| 9,350,101 B2* | 5/2016 | Taylor | .................... | H01R 13/04 |
| 9,711,876 B2* | 7/2017 | Feye-Hohmann | ... | H01R 4/4836 |
| 10,181,673 B1* | 1/2019 | Hemnani | .............. | H01R 13/502 |
| 10,566,753 B2* | 2/2020 | De Bruijn | .............. | H01R 43/16 |
| 2009/0156026 A1* | 6/2009 | Ohmori | ................. | F21V 19/008 |
| | | | | 439/81 |
| 2009/0227143 A1* | 9/2009 | Ichimiya | ................ | H01R 12/57 |
| | | | | 439/620.15 |
| 2012/0327539 A1* | 12/2012 | Washburn | ............ | H01H 61/002 |
| | | | | 361/22 |
| 2016/0197418 A1* | 7/2016 | Feye-Hohmann | ... | H01R 4/4836 |
| | | | | 439/81 |
| 2017/0033483 A1* | 2/2017 | Zhengxi | ................. | H01R 12/58 |

\* cited by examiner

ELECTRICAL EQUIPMENT FOR AN AUTOMOBILE VEHICLE

TECHNICAL FIELD

Generally speaking, the invention relates to an electrical equipment including an electronic board, notably configured to be on board an automobile vehicle, such as an automobile vehicle with an electric or hybrid engine.

More specifically, the electrical equipment is dedicated to the context of an electric or hybrid vehicle driven at least in part by an electric engine.

BACKGROUND

Electronic boards receiving electrical components, notably on their surface, are known. Such electronic boards may be brought to be electrically connected with an electrical component including one or more blade-shaped electrical terminals. To this end, the electronic board generally includes a connector transferred onto the board and forming a female connector into which the blade is inserted. In industrial manufacturing conditions, the direction of insertion Di is generally perpendicular with respect to a face of the electronic board. There may be a misalignment between the opening of the female connector and the blade, which can lead to an impossibility of introducing the blade into the connector of the electronic board in a sufficient manner for an efficient electrical connection. A female connector 1 represented in FIG. 1 is known including a claw 10 coming opposite an extremal edge 51 of the blade 50 so as to compensate for a misalignment of the blade in its direction of introduction Di into the female connector. The connector 1 also makes it possible to manage a lateral misalignment of the blade 50, that is to say along a transversal direction, notably perpendicular, with respect to the direction Di of introduction of the blade 50 into the female connector 1. However, this connector 1 only enables an introduction of the blade 50 following a single sense along the direction Di of introduction of the blade, that is to say from below the connector 1 such as represented in FIG. 1. The connector 1 does not make it possible to introduce the blade 50 along the same direction Di, but from below. Yet, depending on the cluttering of the environment of the electronic board 2 or the components having to be connected to the electronic board 2, it may be advantageous to insert the blade 50 from a side of the board 2 which is opposite to that where the claw 10 extends.

There thus exists a need for an electrical equipment in which a connector of an electronic board enables several senses of insertion of a connection blade, notably along a direction perpendicular to the electronic board.

SUMMARY

To this end, the invention firstly relates to an electrical equipment, notably configured to be on board a vehicle, including:
an electronic board,
a female electrical connector transferred onto the electronic board and configured to receive a blade so as to electrically connect it with the electronic board, said connector including two claws opposite and at a distance from each other, the two claws being configured to receive said blade by each coming around a respective lateral edge of the blade.

Thus, the two claws enable an introduction of the blade in both senses along a direction perpendicular to the electronic board. Thus, the blade may come into the connector from a side of the electronic board where the claws are located, or the blade may come into the connector from a side of the electronic board opposite to the side where the claws are located providing the electronic board so allows. The connector according to the invention thus enables greater possibility of insertion of the blade than in the prior art. Moreover, thanks to the two claws, the female electrical connector is tolerant to a lateral misalignment of the blade with respect to a nominal position of the blade.

According to an embodiment, the claws are respectively formed by at least two opposite spring blades, configured such that a return force brings them towards each other.

According to an alternative, the spring blades are mechanically connected together by a portion, designated linking portion, configured to come opposite a lateral edge of the blade.

According to an alternative, the linking portions are separated by a distance greater than the sum of a width of the blade and a lateral placement uncertainty of the blade.

According to an embodiment, the connector includes two independent parts positioned opposite each other on the electronic board, each independent part including one of said claws.

According to an alternative, said independent parts are identical.

According to an embodiment, the electronic board includes a through hole configured to receive the blade, the claws being positioned at the periphery of said hole so as to receive said blade.

According to an embodiment, the electrical equipment further includes an electrical component comprising a blade-shaped electrical terminal, and the blade is received in the claws of the connector of the electronic board so as to be electrically connected with the electronic board.

According to an embodiment, the electrical equipment forms an inverter configured to control an electrical machine.

BRIEF DESCRIPTION OF THE DRAWINGS

The invention will be better understood on reading the description that follows, given only as an example, and by referring to the appended drawings given as non-limiting examples, in which identical references are given to similar objects and in which.

It should be noted that the figures explain the invention in a detailed manner for implementing the invention, said figures obviously being able to serve to better define the invention if needs be.

DETAILED DESCRIPTION

Figure 2:
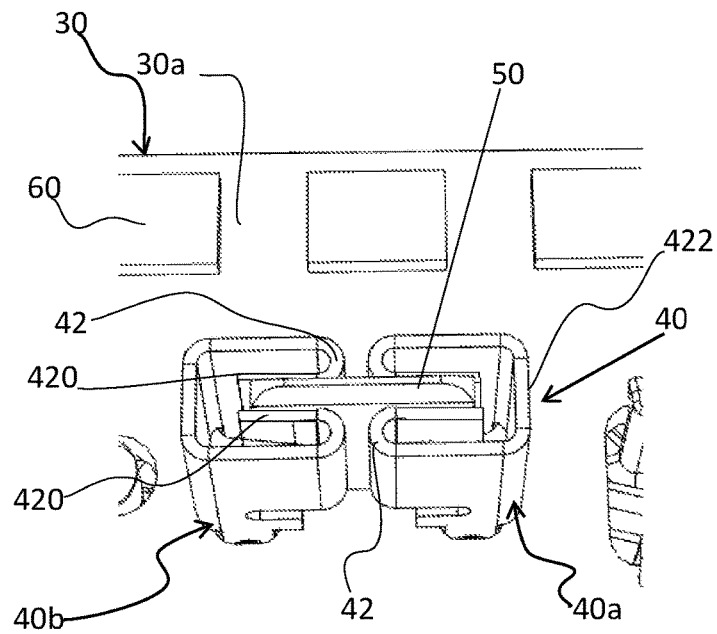
FIG. 2 represents an electrical equipment including an electronic board and a connector according to an example of the invention.

FIG. 2 illustrates an example of an electrical equipment according to the invention, which includes an electronic board 30 and a female connector 40 receiving a blade 50.

The blade 50 is received in the female connector 40 to electrically connect with the electronic board 30, in particular along a direction Di perpendicular to the electronic board 30. Notably, at least one electrical path of the electronic board 30 is connected to the connector 40 to connect it to other components 60 of the electronic board 30.

Figure 5:
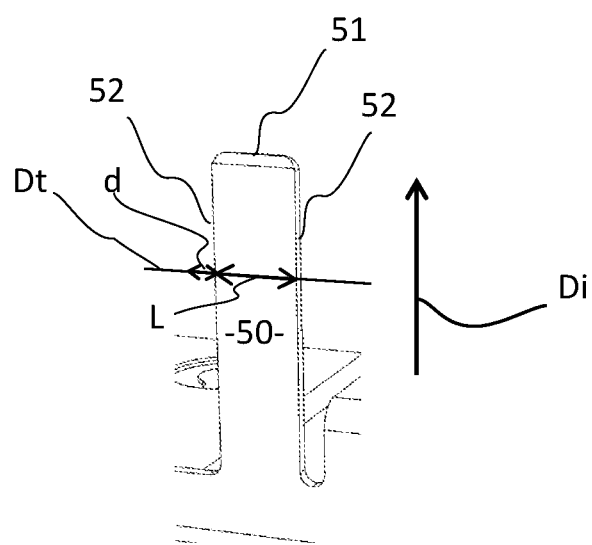
FIG. 5 represents a blade configured to come into the connectors of the other figures.

The connector 40 includes two claws 42 that are opposite each other and at a distance with respect to each other. The two claws 42 each come around a lateral edge 52 of the blade 50. The two claws 42 make it possible to make up for lateral misalignment of the blade 50. In other words, the two claws 42 make it possible to make up for a misalignment of the blade 50 with respect to a nominal position, along a transversal direction Dt, notably perpendicular with respect to the direction Di of introduction of the blade 50 into the female connector 40. Referring to FIG. 5, which represents a blade 50 configured to come into the female connector 40, the direction Dt along which the misalignment is made up may correspond to a straight line linking a lateral edge 52 of the blade 50 to another lateral edge 52 opposite, said straight line being perpendicular to the direction of insertion Di.

Figure 3:
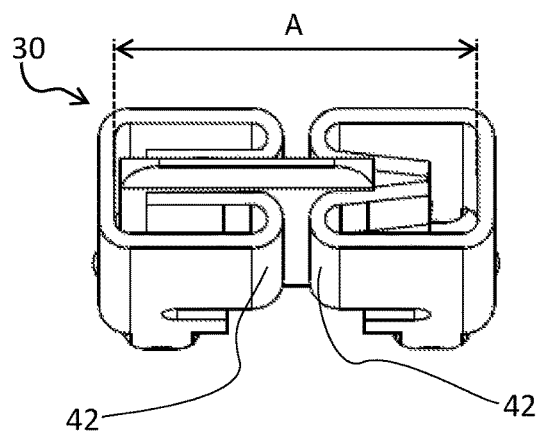
FIG. 3 represents an example in which the blade has a lateral misalignment with respect to the connector.

FIG. 3 illustrates a case in which the blade 50 is misaligned with respect to a nominal position illustrated in FIG. 2. It should be noted that the claws 42 of the connector 40 conserve an electrical contact with the blade 50, even when said blade is laterally offset with respect to the nominal position. Without the claw 42 towards which the blade 50 is laterally offset, such as for example illustrated in FIG. 4, the electrical connection between the blade 50 and the connector 40 is only made by the remaining claw 42. Yet the contact surface between the remaining claw 42 and the blade 50 may then not be sufficient for an efficient electrical contact between the blade 50 and the electronic board 30. Once again referring to FIG. 3, thanks to the claw 42 towards which the blade 50 is laterally offset, the contact surface lost on one side of the connector 40 is compensated by the contact surface gained on the other side of the connector 40.

Figure 1:
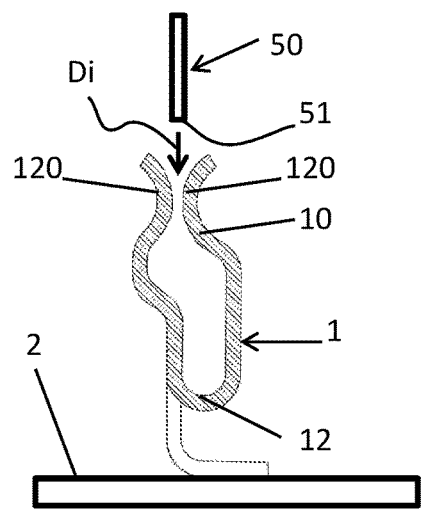
FIG. 1, already described, represents an example of female connector of the prior art mounted on an electronic board.

Notably, each claw 42 is formed by two spring blades 420 that a return force brings towards each other. In particular, the blades 420 of a claw 42 are produced from a same cut and folded sheet. Notably, the spring blades 420 are mechanically connected together by a linking portion 422 which is opposite from the lateral edge 52 of the blade 50. The linking portions 422 may be separated by a distance A which is greater than the sum of a width L of the blade 50 and a lateral placement uncertainty d of the blade 50. Thus, the linking portions 420 do not limit the positioning of the blade 50 in the female connector 40. The female connector 40 is thus adapted to withstand a lateral positioning uncertainty of the blade 50. For example, the blades 420 of a claw 42 may extend parallel to the electronic board 30, notably to one face of the electronic board 30, in their conformation implementing their spring function. For comparison, in the connector 1 of the prior art illustrated in FIG. 1, the blades 120 extend perpendicularly with respect to the electronic board 2, in their conformation implementing their spring function.

Figure 4:
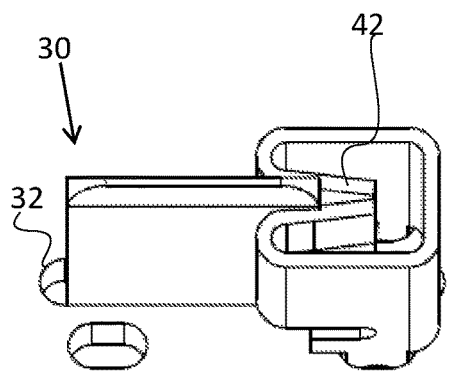
FIG. 4 represents the equipment of FIG. 3 without one of the claws of the connector.

The claws 42 may be formed in two independent parts 40a, 40b, for example as illustrated in FIGS. 2 to 4. In other words, the connector 40 includes two parts 40a, 40b which are independent. The two parts 40a, 40b do not have a common part and are mechanically linked together through the electronic board 30, and optionally the blade 50. In particular, the parts 40a, 40b are identical. Thus, the connector 40 may be obtained easily by using two examples of a single type of connector, each example receiving a respective lateral edge 52 of the blade 50. The connector 40, notably the two independent parts 40a, 40b, may be fixed onto the electronic board 30 by an SMC (surface mounted component) method or by a PTP (pin through paste) method in which pins of the connector 40 or the independent parts 40a, 40b are inserted into holes of the electronic board 30 provided with soldering paste. The soldering paste notably includes a conductive alloy.

Moreover, the connector 40 makes it possible to insert the blade 50 along the direction Di of insertion in the two senses. As is for example visible in FIG. 4, the electronic board 30 may include a through hole 32, on the edges of which the claws 42, in particular the independent parts 40a, 40b, are positioned. Notably, the female connector 40 is mounted on a first face 30a of the electronic board 30. When the blade 50 is introduced into the female connector 40 by the face opposite to the first face 30a of the electronic board 30, the hole 32 enables access into the female connector 40. In an alternative, not represented, when the blade 50 is introduced into the female connector 40 by the first face 30a of the electronic board 30, the hole 32 allows the blade 50 to pass through the first face 30a in the case where the blade 50 could descend further forward into the connector 40 with respect to a nominal position along the direction of insertion Di. In both cases, the hole 32 enables a visual adjustment of the positioning of the blade 50 with the female connector 40 when only a visual of the face of the board which is opposite to the face of the board opposite from which comes the blade 50 is available.

For example, the blade 50 is an electrical connection terminal of a capacitive block. The electronic board 30 is for example configured to produce an active discharge of the capacitive block during a malfunction of the electrical equipment, or of the vehicle containing the electrical equipment.

The electrical equipment could be an inverter, notably an inverter on board a vehicle to control an electrical machine, notably driving the vehicle. Alternatively, the electrical equipment could be an electric charger configured to charge an electric battery. Notably, the electrical equipment is an on board electric charger, commonly designated by those skilled in the art by the acronym OBC, used for recharging a high voltage power supply battery of the vehicle. The electrical equipment could further be a DC-DC converter, notably on board a vehicle in order to convert a voltage between low and high voltage networks of the vehicle.

The invention claimed is:

1. An electrical equipment for an automobile, a vehicle, comprising:
   an electronic board;
   an electrical component comprising a blade-shape electrical terminal;
   a female electrical connector assembled with the electronic board and configured to receive the blade-shape electrical terminal so as to electrically connect it with the electronic board, said female electrical connector comprising two claws opposite to each other and at a distance from each other, said two claws being formed by at least two opposite spring blades and being configured to receive said blade of said electrical component, wherein each of said two claws is configured to come around a respective lateral edge of the blade such that a spring force brings each of said two claws towards one another, and wherein said female electrical connector comprises two independent bodies having no common portion and being positioned opposite to each other on the electronic board, each independent body including one of said two claws.

2. The electrical equipment according to claim 1, wherein the spring blades are mechanically connected together by a linking portion opposite to a lateral edge of the blade.

3. The electrical equipment according to claim 2, the female electrical connector being configured to receive a blade having a width, wherein the linking portions are separated by a distance greater than the sum of the width of the blade and an uncertainty of lateral placement of the blade.

4. The electrical equipment according to claim 1, wherein said independent parts are identical.

5. The electrical equipment according to claim 1, wherein the electronic board includes a through hole configured to receive the blade, said two claws being positioned on the periphery of said hole so as to receive said blade.

6. The electrical equipment according to claim 1, wherein the two independent bodies comprise said two claws.

* * * * *